United States Patent
Kronholz et al.

(10) Patent No.: US 8,614,122 B2
(45) Date of Patent: Dec. 24, 2013

(54) FORMATION OF A CHANNEL SEMICONDUCTOR ALLOY BY FORMING A HARD MASK LAYER STACK AND APPLYING A PLASMA-BASED MASK PATTERNING PROCESS

(75) Inventors: Stephan-Detlef Kronholz, Dresden (DE); Gunda Beernink, Dresden (DE); Carsten Reichel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 56 days.

(21) Appl. No.: 13/238,070

(22) Filed: Sep. 21, 2011

(65) Prior Publication Data
US 2012/0164805 A1   Jun. 28, 2012

(30) Foreign Application Priority Data
Dec. 28, 2010   (DE) .......................... 10 2010 064 281

(51) Int. Cl.
*H01L 21/8238* (2006.01)
(52) U.S. Cl.
USPC ........... 438/199; 438/157; 438/270; 438/197; 438/198; 257/306; 257/330; 257/347; 257/509; 257/77
(58) Field of Classification Search
USPC ......... 438/492, 199, 157, 270, 197, 198, 300, 438/305, 589; 257/306, 330, 347, 77
See application file for complete search history.

(56) References Cited

U.S. PATENT DOCUMENTS

| | | | |
|---|---|---|---|
| 7,282,402 B2 | 10/2007 | Sadaka et al. | |
| 8,293,616 B2 * | 10/2012 | Chang et al. | 438/405 |
| 2006/0175659 A1 | 8/2006 | Sleight | |
| 2008/0303090 A1 | 12/2008 | Ieong et al. | |
| 2009/0291540 A1 | 11/2009 | Zhang et al. | |
| 2010/0213548 A1* | 8/2010 | Chang et al. | 257/348 |
| 2010/0289090 A1* | 11/2010 | Kronholz et al. | 257/392 |
| 2012/0156846 A1 | 6/2012 | Thees et al. | 438/285 |
| 2012/0156864 A1* | 6/2012 | Kronholz et al. | 438/492 |

FOREIGN PATENT DOCUMENTS

| | | | | |
|---|---|---|---|---|
| DE | 102010063296 A1 | 6/2012 | .......... | H01L 21/8234 |
| DE | 102010063774 A1 | 6/2012 | .......... | H01L 21/8234 |

OTHER PUBLICATIONS

Translation of Official Communication from German Patent Application No. 10 2010 064 281.9 dated Jul. 6, 2011.
Translation of Official Communication from German Patent Office for German Patent Application No. 10 2010 064 281.9 dated Jul. 2, 2012.

* cited by examiner

*Primary Examiner* — Telly Green
(74) *Attorney, Agent, or Firm* — Williams, Morgan & Amerson, P.C.

(57) ABSTRACT

When forming sophisticated high-k metal gate electrode structures, a threshold adjusting semiconductor alloy may be formed on the basis of selective epitaxial growth techniques and a hard mask comprising at least two hard mask layers. The hard mask may be patterned on the basis of a plasma-based etch process, thereby providing superior uniformity during the further processing upon depositing the threshold adjusting semiconductor material. In some illustrative embodiments, one hard mask layer is removed prior to actually selectively depositing the threshold adjusting semiconductor material.

20 Claims, 7 Drawing Sheets

FORMATION OF A CHANNEL SEMICONDUCTOR ALLOY BY FORMING A HARD MASK LAYER STACK AND APPLYING A PLASMA-BASED MASK PATTERNING PROCESS

BACKGROUND OF THE INVENTION

1. Field of the Invention

Generally, the present disclosure relates to integrated circuits including sophisticated transistor elements that comprise advanced gate structures including a metal-containing electrode and a high-k gate dielectric of increased permittivity.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry including field effect transistors, MOS technology is one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a material for a gate insulation layer that separates the gate electrode, frequently comprised of polysilicon or metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current due to the required enhanced capacitive coupling of the gate electrode to the channel region that is accomplished by decreasing the thickness of the silicon dioxide layer.

Therefore, replacing silicon dioxide, or at least a part thereof, as the material for gate insulation layers has been considered. Possible alternative dielectrics include materials that exhibit a significantly higher permittivity so that a physically greater thickness of a correspondingly formed gate insulation layer nevertheless provides a capacitive coupling that would be obtained by an extremely thin silicon dioxide layer. It has thus been suggested to replace silicon dioxide with high permittivity materials, such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

When advancing to sophisticated gate architectures based on high-k dielectrics, additionally, transistor performance may also be increased by providing an appropriate conductive material for the gate electrode so as to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance even at a less critical thickness compared to a silicon dioxide layer, while additionally maintaining leakage currents at an acceptable level. On the other hand, a metal-containing non-polysilicon material, such as titanium nitride and the like, may be formed so as to directly connect to the high-k dielectric material, thereby substantially avoiding the presence of a depletion zone. Therefore, the threshold voltage of the transistors is significantly affected by the work function of the gate material that is in contact with the gate dielectric material, and an appropriate adjustment of the effective work function with respect to the conductivity type of the transistor under consideration has to be guaranteed.

For example, appropriate metal-containing gate electrode materials, such as titanium nitride and the like, may frequently be used in combination with appropriate metal species, such as lanthanum, aluminum and the like, so as to adjust the work function to be appropriate for each type of transistor, i.e., N-channel transistors and P-channel transistors, which may require an additional band gap offset for the P-channel transistor. For this reason, it has been proposed to appropriately adjust the threshold voltage of transistor devices by providing a specifically designed semiconductor material at the interface between the gate dielectric material and the channel region of the transistor device, in order to appropriately select the band gap of the specifically designed semiconductor material to the work function of the metal-containing gate electrode material, thereby obtaining the desired threshold voltage of the transistor under consideration. Typically, a corresponding specifically designed semiconductor material, such as silicon/germanium and the like, may be provided by an epitaxial growth technique at an early manufacturing stage, which may also represent an additional complex process step, which, however, may avoid complex processes in an advanced stage for adjusting the work function and thus the threshold voltages in a very advanced process stage.

It turns out, however, that the manufacturing sequence of forming the threshold adjusting semiconductor alloy may have a significant influence on transistor characteristics, as will be described in more detail with reference to FIGS. 1a-1f.

FIG. 1a schematically illustrates a cross-sectional view of a semiconductor device 100 comprising a substrate 101 above which is formed a silicon-based semiconductor material 102 having an appropriate thickness for forming therein and thereabove transistor elements. Furthermore, an isolation structure 102C is formed in the semiconductor layer 102, thereby laterally delineating and thus defining active regions 102A, 102B. In this context, an active region is to be understood as a semiconductor material in which an appropriate dopant profile is formed or is to be created in order to form PN junctions for one or more transistor elements. In the example shown in FIG. 1a, the active region 102A corresponds to a P-channel transistor, while the active region 102B represents an N-channel transistor. That is, the active regions 102A, 102B comprise an appropriate basic dopant concentration in order to determine the conductivity of a P-channel transistor and an N-channel transistor, respectively. It should be appreciated that the active regions 102A, 102B may comprise or may receive other components, such as germanium, carbon and the like, in order to appropriately adjust the overall electronic characteristics. Similarly, in the active region 102A, an appropriate valence band offset is to be adjusted with respect to a sophisticated gate electrode structure still to be formed by forming an appropriate semiconductor alloy, as will be described later on.

The semiconductor device 100 as illustrated in FIG. 1a may be formed on the basis of the following conventional process strategies. The isolation structure 102C is formed by well-established lithography, etch, deposition, planarization and anneal techniques, in which appropriate hard mask layers, such as a pad oxide and a silicon nitride material, are formed on the semiconductor layer 102, followed by the patterning of a trench in the semiconductor layer 102. Thereafter, the trench is filled with an appropriate insulating material, such as silicon dioxide and the like. It should be appreciated that the process sequence for forming the isolation structure 102C may result in a more or less pronounced stress level in the active regions 102A, 102B. After the removal of any excess material and planarizing the surface topography, the further processing is typically continued by performing a plurality of implantation processes using an appropriate masking regime in order to introduce the required dopant species for generating the basic dopant concentration in the active regions 102A, 102B, as required in view of the transistors to be formed therein and thereabove. After activating the dopant species and re-crystallizing implantation-induced damage, the further processing is continued by removing any material residues, such as oxide materials, and exposing the device 100 to an oxidizing ambient 110, which is typically established on the basis of elevated temperatures, for instance in the range of 700-1200° C. Consequently, during the dry oxidation process 110, a mask layer 104 is formed in a well-controllable manner during the process 110. For example, a maximal thickness of the mask layer 104 is adjusted to 10 nm or less.

FIG. 1b schematically illustrates the semiconductor device 100 in a further advanced manufacturing stage, in which an etch mask 105 in the form of a resist material is formed above the semiconductor device 100 such that the active region 102B, i.e., the mask material 104, and a part of the isolation structure 102C are covered by the mask 105, while the active region 102A, i.e., the mask material 104 formed thereon, and the remaining part of the isolation structure 102C are exposed to a wet chemical etch ambient 111 in order to selectively remove the mask material 104 from the active region 102A. During the etch process 111, which is typically performed on the basis of diluted hydrofluoric acid (HF), the resist material 105 has to withstand the etch attack, wherein, in particular, the edge 105E of the mask 105 positioned above the isolation structure 102C may be increasingly eroded during the etch process 111. For example, an etch time of several minutes may be required in order to reliably remove the mask material 104 from the active region 102A. Due to the increasing erosion of the edge region 105E, the boundary between the mask area and the non-mask area in the isolation region 102C may not be well defined and may thus result in a certain degree of roughness due to the varying degree of material erosion, which may affect the further processing of the device 100, in particular when the active regions 102A, 102B represent closely-spaced active regions, which are thus laterally delineated by the isolation region 102C including the eroded surface area.

FIG. 1c schematically illustrates the semiconductor device 100 in a further advanced manufacturing stage, i.e., after the selective removal of the mask material 104 from above the active region 102A and after the removal of the etch mask 105 (FIG. 1b). As discussed above, due to the preceding etch sequence based on hydrofluoric acid, a certain material loss may occur in the isolation structure 102C, wherein the increasing mask erosion during the etch process may result in a non-well-defined transition area in the isolation region 102C.

FIG. 1d schematically illustrates the semiconductor device 100 when exposed to a further reactive process ambient 106, which may include a cleaning process and the like in order to prepare the device 100 for the subsequent deposition of a silicon/germanium alloy selectively on the first active region 102A. The process 106 may be established on the basis of any appropriate chemistry in order to remove contaminants and the like, which may have been produced during the previous removal of the etch mask and the like. Typically, the cleaning process 106 may cause a certain degree of material erosion of the mask 104, thereby reducing its thickness, as indicated by 104R, however, without exposing the surface portions of the second active region 102B.

FIG. 1e schematically illustrates the semiconductor device 100 during a selective epitaxial growth process 107, in which process parameters, such as temperature, pressure, flow rates of precursor gases and the like, are appropriately selected such that a material deposition is substantially restricted to exposed silicon surface areas, while the silicon dioxide-based surface areas substantially prevent a deposition of material. That is, the deposition process 107 may be adjusted such that a certain degree of deposition selectivity is obtained with respect to silicon material in the active region 102A and any oxide surface areas, such as the deposition mask 104 and the isolation region 102C. As previously explained, the finally-obtained threshold voltage of a transistor to be formed in and above the active region 102R strongly depends on the characteristics of the silicon/germanium material 108, such as the germanium concentration thereof and the thickness, such that precisely determined process conditions have to be established during the process 107. After the deposition of silicon/germanium alloy 108, which is now a part of the active region 102A having the appropriate band gap for forming thereon sophisticated gate electrode structures, the deposition mask 104 is removed, for instance by using hydrofluoric acid, which in turn may also result in a certain material removal in the isolation region 102C, thereby contributing to a further pronounced surface topography between the active regions 102A, 102B and the isolation region 102C, which may additionally have a pronounced surface topography due to the previously-performed etch process 111 as described with reference to FIG. 1b.

FIG. 1f schematically illustrates the semiconductor device 100 in a further advanced manufacturing stage in which a transistor 150A is formed in and above the active region 102A, which now includes at least a portion of the silicon/germanium alloy 108. Similarly, a transistor 150B is formed in and above the active region 102B. Moreover, the transistors 150A, 150B, for instance representing a P-channel transistor and an N-channel transistor, respectively, comprise gate electrode structures 160A, 160B, respectively. As shown, the gate electrode structure 160A is formed on the threshold adjusting silicon/germanium alloy 108 and comprises a gate dielectric material 161, which includes a high-k dielectric material, wherein the gate dielectric material 161 is covered by a metal-containing electrode material 162. Moreover, a conventional electrode material, such as amorphous silicon, polycrystalline silicon and the like 163, is typically formed above the electrode material 162. Moreover, the sensitive materials 161 and 162 are laterally confined by an appropriate spacer or liner material 165, for instance, provided in the form of a silicon nitride material and the like. Furthermore, a sidewall spacer structure 164, which may comprise one or more spacer elements, possibly in combination with any etch stop liners, is provided according to the process and device requirements. The gate electrode structure 160B has a similar configuration, wherein, however, the gate dielectric material 161 is directly formed on the active region 102B. It should be appreciated that the gate electrode structures 160A, 160B may further differ from each other with respect to the resulting work function of the material layers 162. That is, the transistor 150A may require a different work function so as to obtain, in combination with the silicon/germanium material 108, the desired threshold voltage for a P-channel transistor. To this end, any appropriate work function metal species, such as aluminum, may be incorporated into the layer 162 and/or the gate dielectric layer 161. Similarly, an appropriate work function metal species, such as lanthanum and the like, may be incorporated into the layer 162 and/or the layer 161 of the transistor 150B in order to obtain the desired threshold voltage.

The semiconductor device 100 as shown in FIG. 1f may be formed on the basis of any well-established process techniques, which include the deposition of the materials 161, 162 and 163, possibly in combination with other materials, such as dielectric cap layers, anti-reflective coating (ARC) materials and the like. As discussed above, appropriate patterning regimes and materials may be used for the layers 161 and 162 so as to obtain a desired high capacitive coupling in combination with a superior conductivity, while also a desired work function and thus threshold voltage for the transistor 150A, 150B, wherein the silicon/germanium alloy 108 provides the desired end gap offset. After the patterning of the sophisticated layer stack, at least the sensitive materials 161 and 162 have to reliably be confined in order to not unduly expose these materials to any reactive process atmospheres, which may otherwise result in significant modifications of these materials, which in turn may lead to a significant drift of the resulting threshold voltage. To this end, sophisticated deposition techniques may be applied in order to form the liner 165, followed by appropriate deposition and etch processes for forming a part of the sidewall spacer structure 164, which may then be used to introduce dopant species for forming drain and source regions 153 in the active regions 102A, 102B, respectively. To this end, well-established implantation strategies and masking regimes may be applied. Thereafter, an anneal process may be applied, thereby adjusting the final lateral and vertical profile of the drain and source regions 153, thereby also adjusting the final length of a channel region 152 positioned below the respective gate electrode structures 160A, 160B.

It should be appreciated that, although the above-described process strategy may enable forming sophisticated gate electrode structures and thus transistors, a significant variability of the transistor characteristics therein may, however, be observed. For example, the characteristics of the silicon/germanium alloy 108 may vary in a length direction, i.e., in FIG. 1f the horizontal direction, which may, however, not negatively affect the resulting transistor characteristics. On the other hand, a significant variation of the material characteristics is observed in the transistor width direction, i.e., in a direction perpendicular to the drawing plane of FIG. 1f, wherein basically the same edge effects may be observed, which may, for instance, be caused by a pronounced surface topography between the isolation region 102C and the active region 102A, while other negative influences may be caused by the previously-used deposition mask 104 (FIGS. 1a and 1b) since the formation thereof and the selective removal may result in different conditions in the center of the active region 102A compared to the edge thereof. Furthermore, the irregular surface topography of the isolation region 102C, in particular between closely-spaced transistor devices, may also affect the process of forming the protective liner or spacer 165, which in turn may result in a deterioration of the sensitive materials 161 and 162 in one or both of the transistors 150A, 150B, which, thus, also may contribute to significant yield losses.

In view of the situation described above, the present disclosure relates to techniques in which gate electrode structures may be formed on the basis of a threshold adjusting semiconductor alloy, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques for forming complex gate electrode structures on the basis of a threshold adjusting semiconductor alloy, wherein transistor variability may be reduced and overall process uniformity may be enhanced by reducing any process non-uniformities, which may be introduced upon forming a growth mask on the basis of an oxidation process in combination with wet chemical etch recipes for selectively removing the growth mask from one of the active regions. To this end, in some illustrative embodiments disclosed herein, an appropriate mask material may be provided on the basis of a deposition process, for instance in the form of a silicon nitride material, while the patterning of the mask material may be accomplished by using a plasma-based etch process, i.e., an etch process performed on the basis of reactive ions that are present in the reactive process atmosphere and which are accelerated towards the surface of the substrate. In this manner, well-defined process conditions may be achieved upon forming the deposition mask and, thereafter, upon selectively depositing the threshold adjusting semiconductor material, which may result in superior uniformity of the resulting transistor characteristics. Moreover, the exposure to highly aggressive wet chemical etch chemistries, such as hydrofluoric acid, may be reduced during the entire process flow, thereby also contributing to superior device characteristics, since a less pronounced difference in surface topography between isolation regions and active regions may be achieved. In illustrative aspects disclosed herein, at least two hard mask layers may be provided, one of which may be formed on the basis of deposited hydride-based material, thereby enabling the patterning thereof on the basis of well-establish anisotropic etch techniques. During the selective epitaxial growth process, the patterned hard mask stack or a portion thereof may be efficiently used as a deposition mask, wherein, in some illustrative embodiments, similar growth conditions may be accomplished as in conventional well-established strategies, in which process parameters may be used that provide a pronounced selectivity between silicon and silicon dioxide material.

One illustrative method disclosed herein comprises forming a first hard mask layer on a first active region and a second active region of a semiconductor device. Moreover, a second hard mask layer is formed on the first hard mask layer and the first and second hard mask layers are selectively removed from the first active region by performing a plasma-assisted etch process. The method further comprises forming a layer of a semiconductor alloy on the first active region and using at least one of the first and second hard mask layers on the second active region as a growth mask. The method further comprises exposing the second active region and forming a first gate electrode structure of a first transistor on the layer of a semiconductor alloy and forming a second gate electrode structure of a second transistor on the second active region. The first and second gate electrode structures comprise a metal-containing gate electrode material and a gate insulation layer that comprises a high-k dielectric material.

A further illustrative method disclosed herein relates to forming a semiconductor device. The method comprises forming a first hard mask layer on a first active region and a second active region. Moreover, a second hard mask is formed on the first hard mask layer and the first and second hard mask layers are selectively removed from the first active region. The method further comprises removing the second hard mask layer from above the second active region after the removal of the first and second hard mask layers from the first active region. Additionally, the method comprises forming a layer of a semiconductor alloy in the first active region by using the first hard mask layer as a growth mask. Furthermore, a first gate electrode structure of a first transistor is formed on the first active region that includes the layer of a semiconductor alloy, and a second gate electrode structure of a second transistor is formed on the second active region.

A still further illustrative embodiment disclosed herein comprises forming a mask layer stack on a first active region and a second active region of a semiconductor device. The method further comprises removing the mask layer stack selectively from the first active region by performing at least one plasma-based etch process. Moreover, a layer of a semiconductor alloy is formed on the first active region while using at least one layer of the mask layer stack on the second active region as a growth mask. Additionally, an etch process is performed so as to expose the second active region and a first gate electrode structure is formed on the first active region and a second gate electrode structure is formed on the second active region. Additionally, a strain-inducing semiconductor material is formed at least in the first active region in the presence of the first gate electrode structure.

BRIEF DESCRIPTION OF THE DRAWINGS

The disclosure may be understood by reference to the following description taken in conjunction with the accompanying drawings, in which like reference numerals identify like elements, and in which.

Figure 1A:
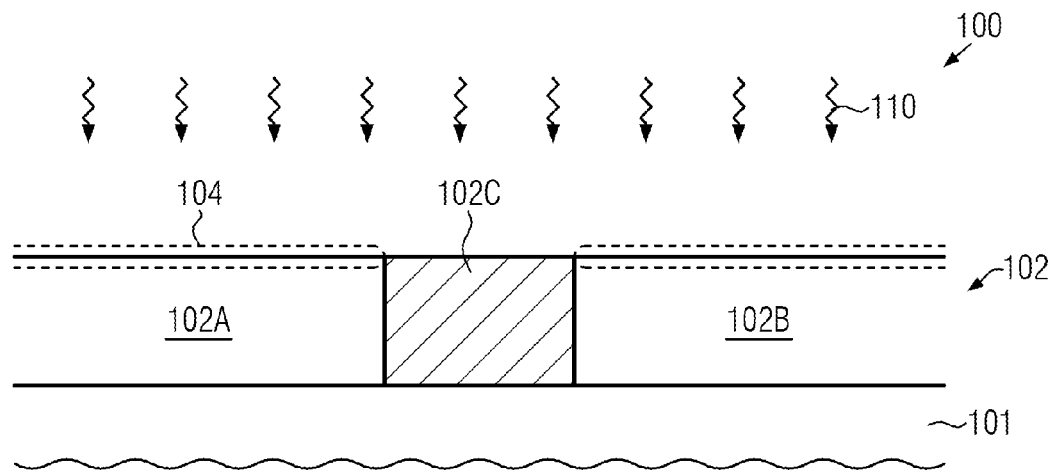
FIGS. 1a-1f schematically illustrate cross-sectional views of a conventional semiconductor device in which sophisticated gate electrode structures are formed on the basis of a silicon/germanium alloy for adjusting a threshold voltage of the P-channel transistor, which may result in pronounced transistor variability.
Figure 1B:
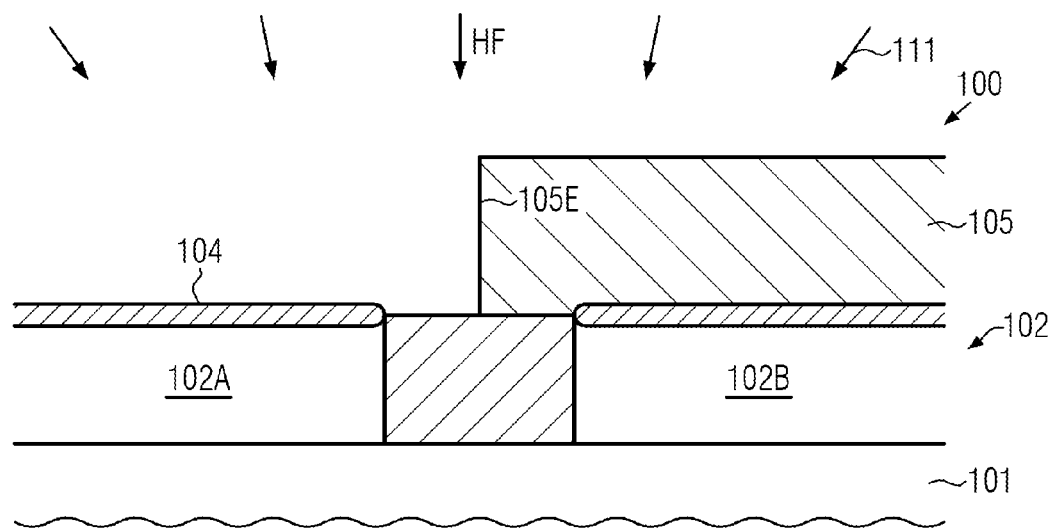
Figure 1C:
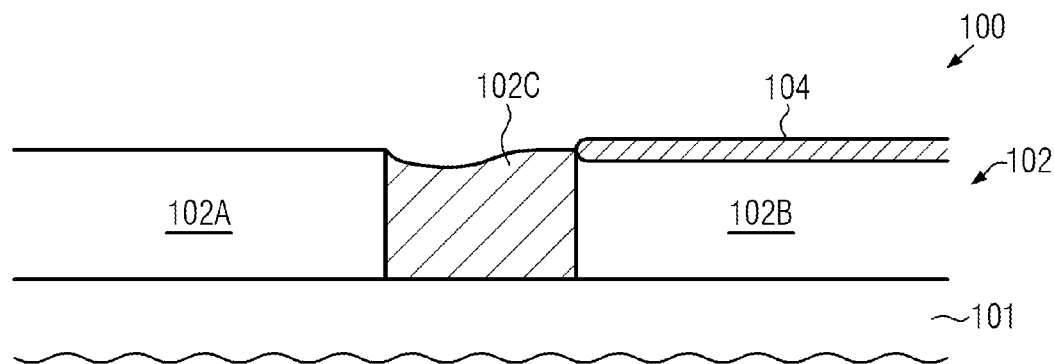
Figure 1D:
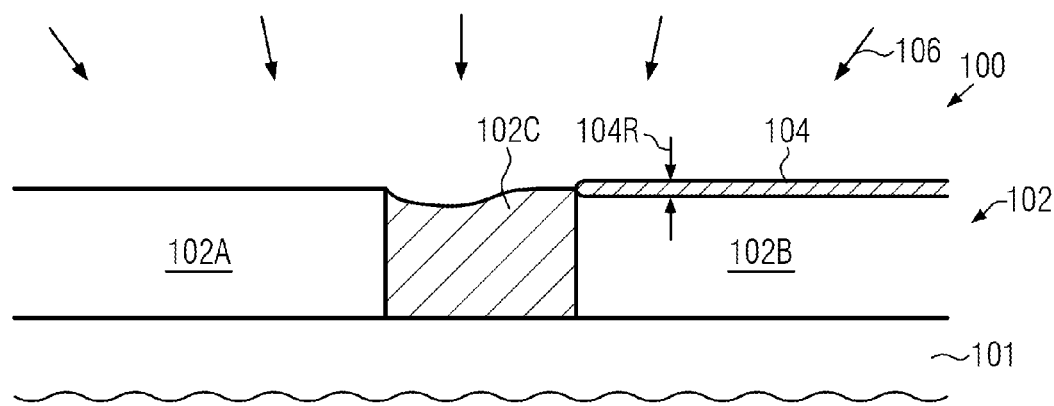
Figure 1E:
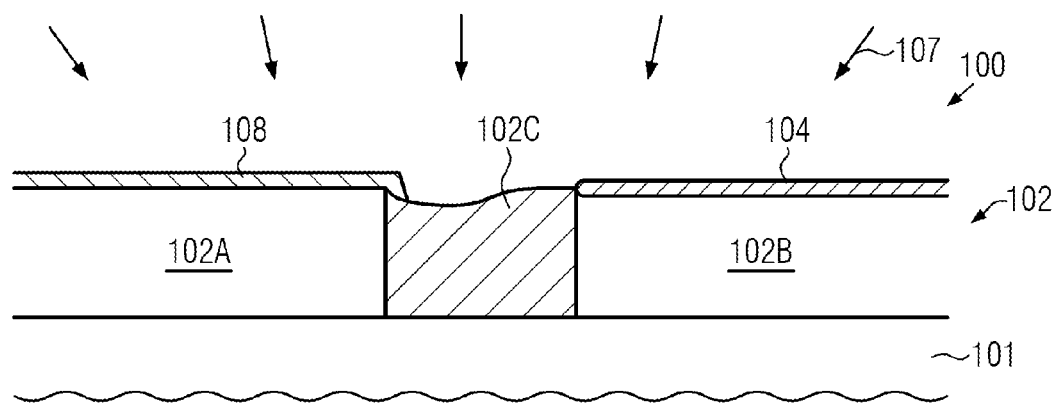
Figure 1F:
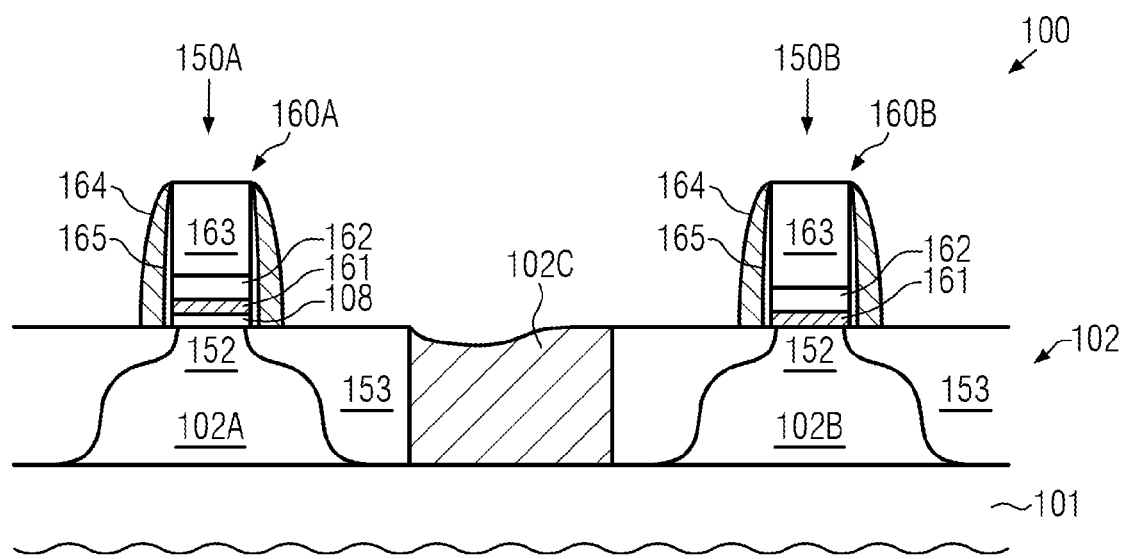

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure contemplates process techniques in which a threshold adjusting semiconductor alloy, such as a silicon/germanium alloy, may be selectively formed in one type of transistor, while covering one or more other types of transistors during the selective deposition process. To this end, basically a hard mask may initially be provided in the form of a deposited material, such as silicon nitride material, which may be efficiently patterned on the basis of a plasma-based etch process, such as reactive ion etching, which may result in superior process conditions during the subsequent processing of the device, i.e., when forming the threshold adjusting semiconductor alloy. In some illustrative embodiments, the hard mask may be provided as a stack of layers, for instance comprising a silicon-dioxide material, which may be formed in an earlier manufacturing stage with a high degree of process uniformity, while a subsequent material layer, such as a silicon-nitride material, may be formed on the basis of a deposition process. In some illustrative embodiments disclosed herein, the modification of providing and patterning the hard mask may be restricted to a specific section within the overall process flow, without requiring any changes of the preceding process flow. To this end, the silicon nitride material or any other appropriate hard mask material may be directly deposited on the pad oxide, which may previously have been formed upon forming the isolation trenches and defining the basic doping in the active regions. Consequently, the pad oxide may be advantageously used as a first hard mask material, which may enable the subsequent deposition of the further hard mask material, which then in turn enable the patterning of the entire hard mask on the basis of a plasma-assisted etch process. In some illustrative embodiments, superior uniformity of the overall process flow may be achieved by introducing an additional control mechanism for enduring a uniform thickness of the pad oxide prior to the actual deposition of the further hard mask material. To this end, the layer thickness of the pad oxide may be determined, for instance, on the basis of well-established optical inspection techniques and the like, and the measured layer thickness may then be used as an input variable for controlling a subsequent wet chemical process for reducing/increasing the thickness of the pad oxide layer so as to obtain similar process conditions for the subsequent process sequence, irrespective of any non-uniformities, which may result in a varying pad oxide thickness during the preceding processes. For example, a wet chemical process on the basis of SPM/APM (sulfuric acid hydrogen peroxide mixture/ammonium hydroxide hydrogen peroxide mixture) may be efficiently used in order to adjust the initial pad oxide thickness prior to depositing a further hard mask material. In some cases, an additional measurement process may be applied after the wet chemical process so as to achieve superior overall process control.

In some illustrative embodiments, the superior patterning conditions by using the deposited hard mask material in combination with a plasma-based etch process may be combined with an additional removal process for removing the deposited hard mask material selectively with respect to the underlying pad oxide material, which may, due to its superior uniformity, be efficiently used as the actual deposition mask. In other cases, the initial hard mask layer stack may be used as a deposition mask and may be subsequently removed on the basis of any appropriate etch techniques.

Since a significantly lesser amount of aggressive hydrofluoric acid-based etch chemistry has to be applied upon forming the threshold adjusting semiconductor alloy, superior conditions may also be achieved with respect to a topography difference between the active regions and the isolation regions. This may advantageously influence the further processing, for instance in sophisticated applications, in which an embedded strain-inducing semiconductor alloy is to be provided in one or both of the active regions, since in particular the reduced difference in surface topography between isolation regions and active regions may result in superior growth conditions at the transistor sides that directly connect to a corresponding isolation region. Consequently, also in this case, superior transistor performance and transistor uniformity may be achieved.

With reference to FIGS. 2a-2l, further illustrative embodiments will now be described in more detail, wherein reference may also be made to FIGS. 1a-1f, if required.

Figure 2A:
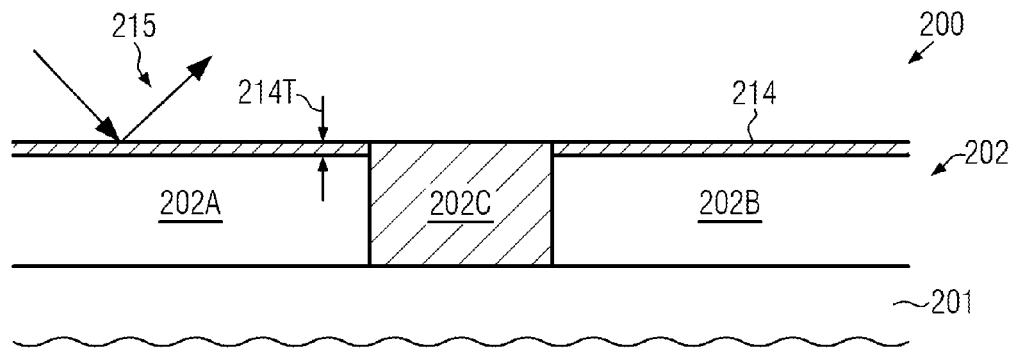
FIGS. 2a-2j schematically illustrate cross-sectional views of a semiconductor device during various manufacturing stages, in which a threshold adjusting semiconductor material may be formed selectively in one type of active region with superior uniformity by using a mask layer stack and plasma-based etch process, wherein only a portion of the mask layer stack is used as a deposition mask, according to illustrative embodiments.

FIG. 2a schematically illustrates a cross-sectional view of a semiconductor device 200 comprising a substrate 201 and a semiconductor layer 202, which may comprise a plurality of active regions that are laterally delineated by an isolation region 202C. For convenience, a first active region 202A and a second active region 202B are illustrated in FIG. 2a. Moreover, a first hard mask layer, for instance in the form of a so-called pad oxide 214, may be provided on the active regions 202A, 202B and may have a specific thickness 214T, which may depend on the process history of the device 200.

Basically, the semiconductor device 200 as shown in FIG. 2a may be formed on the basis of process techniques as are also previously described with reference to the semiconductor device 100. It should be appreciated, however, that upon forming the isolation region 202C and thus laterally delineating the active regions 202A, 202B, the pad oxide layer 214 may be preserved, which may initially be formed prior to performing any additional manufacturing steps and, thus, prior to forming the isolation region 202C and the active regions 202A, 202B. To this end, any well-established process strategies may be used, such as oxidation, deposition and the like, thereby obtaining a very uniform material layer with a uniform thickness of, for instance, approximately 4-8 nm, for example 5 nm. After forming the isolation region 202C, as described above, any excess material, such as a silicon nitride material used as a hard mask material, may be removed and subsequently respective implantation processes in combination with masking processes may be applied in order to selectively incorporate any well dopant species into the active regions 202A, 202B. Consequently, due to the lithography processes involved, a certain degree of material erosion may occur in the pad oxide layer 214, which may thus result in the thickness 214T, which may vary to a certain degree, depending on any previous process fluctuations. According to some illustrative embodiments, therefore, a measurement process 215 may be performed so as to determine the layer thickness 214T prior to continuing the processing of the device 200 by performing a process module, in which a threshold adjusting semiconductor material is to be formed in the active region 202A. To this end, any well-established inspection techniques may be applied.

Figure 2B:
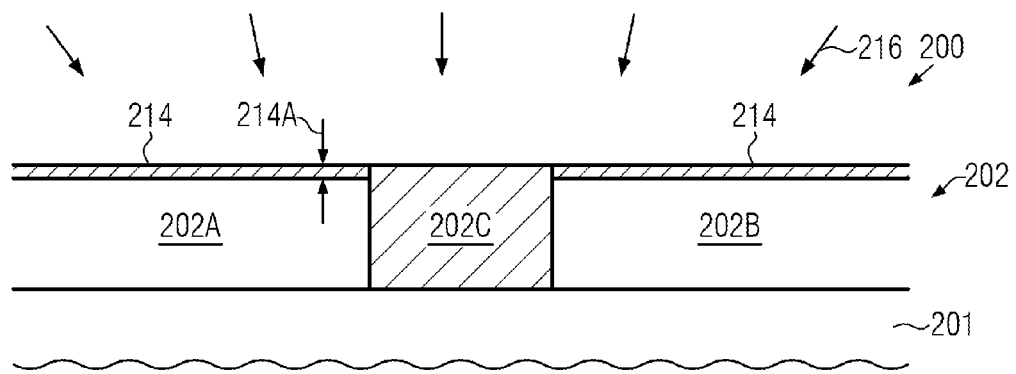

FIG. 2b schematically illustrates the semiconductor device 200 when exposed to a reactive ambient of a wet chemical process 216. The process 216 may be performed on the basis of a wet chemical chemistry, for instance using well-established cleaning chemistries, such as SPM, APM and the like, wherein at least one process parameter, such as the process time, may be controlled on the basis of the measurement results of the process 215 of FIG. 2a. For example, if the initial layer thickness 214T (FIG. 2a) is sufficient for the further processing, if, however, for superior process uniformity a further reduction is considered appropriate, the process 216 may be performed as an efficient cleaning or etching process, which may be controlled so as to reduce the thickness so as to obtain a desired target thickness 214A. In other cases, the chemical process 216 may result in a further oxidation of the active regions 202A, 202B in a highly-controlled manner, when the initial thickness 214T of FIG. 2a is considered too little compared to a desired target value. Consequently, the further processing may be continued on the basis of the layer thickness 214A, which may be close to the desired target thickness, wherein, if desired, a further measurement process may be applied after the process 216 in order to determine the process result. In this case, any devices 200 which may not comply with the desired target thickness may be re-worked in order to provide superior process uniformity.

Figure 2C:
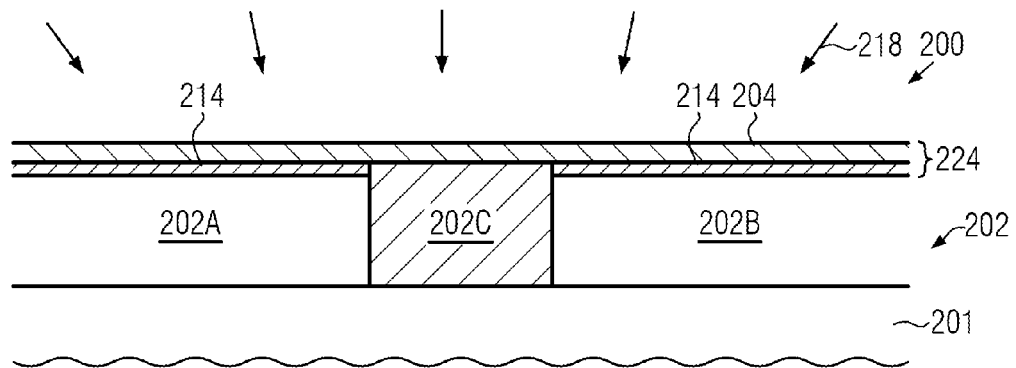

FIG. 2c schematically illustrates the semiconductor device 200 during a deposition process 218, such as a plasma-assisted chemical vapor deposition (CVD) process, a thermally-activated CVD process and the like. During the deposition process 218, a second hard mask layer 204, which may be comprised of any appropriate material, may be formed on the hard mask layer 214, thereby forming a hard mask layer stack 224. In some illustrative embodiments, the layer 204 may be formed as a silicon and nitrogen-containing material, which may also be referred to as silicon nitride material, even if other atomic species may be incorporated to a certain degree. The layer 204 may be provided with a thickness of approximately 5-50 nm, depending on the further processing of the device 200. Consequently, due to the previous adjustment of the thickness of the layer 214 and due to the uniform deposition conditions for providing the layer 204, the hard mask material layer stack 224 may have highly uniform characteristics in terms of layer thickness and material composition.

Figure 2D:
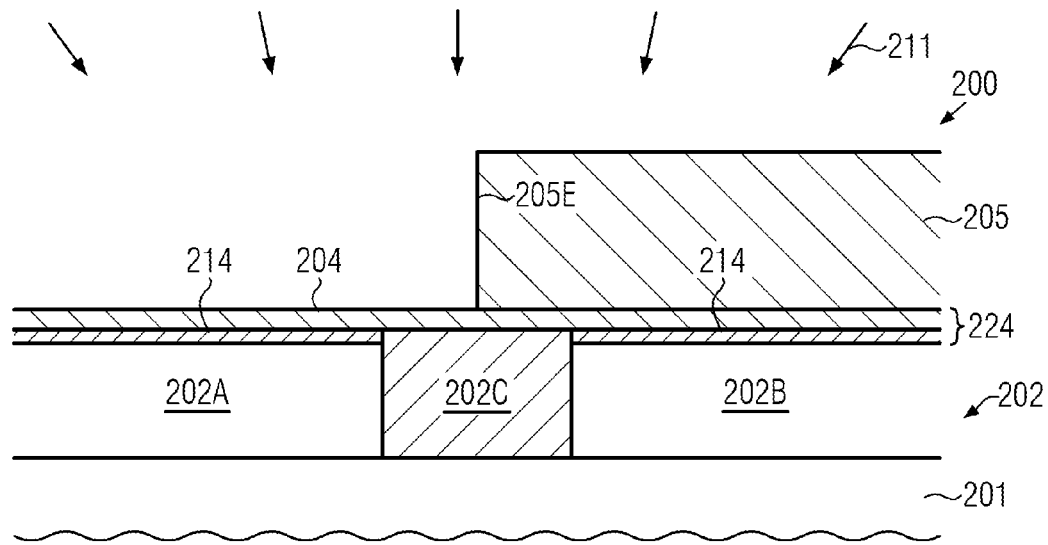
Figure 2E:
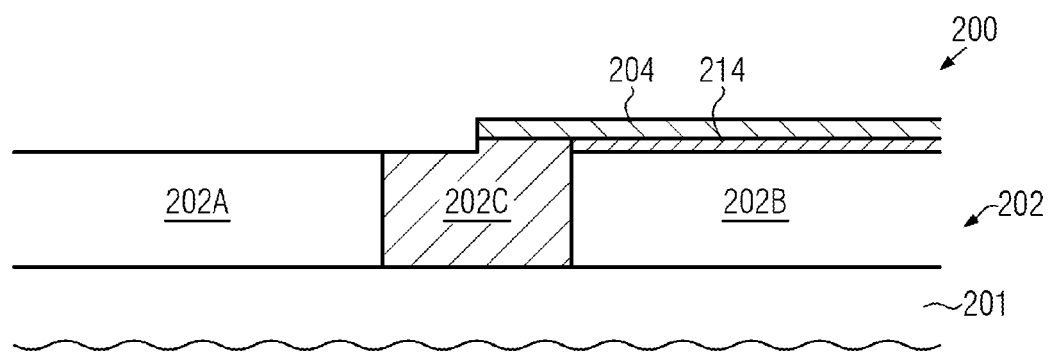

FIG. 2d schematically illustrates the semiconductor device 200 in a manufacturing stage in which an etch mask 205, such as a resist mask, may be formed so as to expose the layers 214, 204 above the active region 202A and a portion of the isolation region 202C, while the remaining portion of the region 202C and the active region 202B, i.e., the hard mask layers 204, 214 formed thereon are covered. To this end, any well-established lithography technique may be applied. Further-more, the device 200 is exposed to a reactive etch process 211 based on a gaseous etch atmosphere including reactive ions, which may be generated on the basis of a plasma ambient. It should be appreciated that, generally, a plurality of plasma-based etch techniques are well established in the art, wherein a certain degree of physical and chemical interaction with a substrate to be etched may differ. In the context of the present disclosure, however, any type of ion etching in a gaseous ambient may be considered as a plasma-based or plasma-assisted etch process, such as reactive ion etching and the like. In one illustrative embodiment, the plasma-assisted etch process 211 may be performed on the basis of a well-established etch recipe, which may exhibit a moderately high selectivity, at least with respect to the silicon material in the active region 202A. In this case, the layer 204 and also the layer 214 may be efficiently removed during the etch process 211, while on the other hand, the etch mask 205 may not be unduly modified at an edge region 205E. That is, contrary to conventionally-applied wet chemical etch techniques, for instance based on hydrofluoric acid, as previously discussed, the etch mask 205 is exposed to the reactive atmosphere of the process 211 for a significantly reduced time interval, thereby substantially suppressing any undue interactions with the process 211, which in turn may result in a well-defined etch result above the isolation region 202C. That is, any pronounced material erosion at the edge region 205E may be significantly less pronounced during the process 211, since a typical process time may be in the range of 15-50 seconds, compared to ten minutes and more in conventional wet chemical etch techniques.

FIG. 2d schematically illustrates the semiconductor device 200 in a further advanced manufacturing stage, i.e., after the plasma-based etch process 211 and after the removal of the etch mask 205 of FIG. 2d. As shown, the silicon material in the active region 202A may be exposed and also a superior surface topography with respect to the adjacent portion of the isolation region 202C may be accomplished, while at the same time a well-defined transition from the topography of the isolation region 202C adjacent to the active region 202A to the surface topography in the remaining portion of the isolation region 202C may be achieved. For this reason, the further processing, i.e., the selective epitaxial growth of a threshold adjusting semiconductor material on the exposed active region 202A may be performed with superior process uniformity.

Figure 2F:
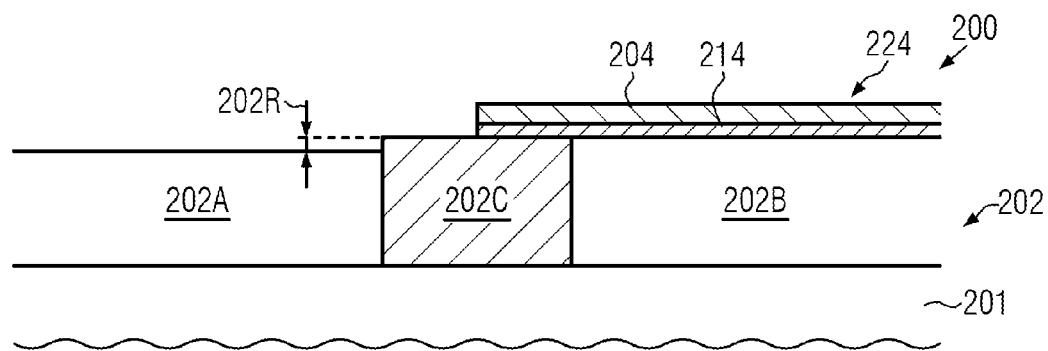

FIG. 2f schematically illustrates the semiconductor device 200 according to further illustrative embodiments in which process parameters of the plasma-assisted etch process 211 of FIG. 2d may result in a certain degree of recessing 202R when, for example, the etch rate of the silicon dioxide material of the isolation region 202C may be lower compared to the etch rate of the material 214. In other cases, the layer 214 may be formed by deposition and thus may also cover the isolation region 202C so that, during the etch process 211 of FIG. 2d, the silicon material of the active region 202A may be substantially simultaneously exposed as the initial material of the isolation region 202C. In this case, an etch chemistry may be used in which silicon may etch with a somewhat higher removal rate compared to the silicon dioxide material of the isolation region 202C. Consequently, by controlling the overall etch time, the degree of recessing 202R may be controlled, if considered appropriate for the further processing of the device 200.

Figure 2G:
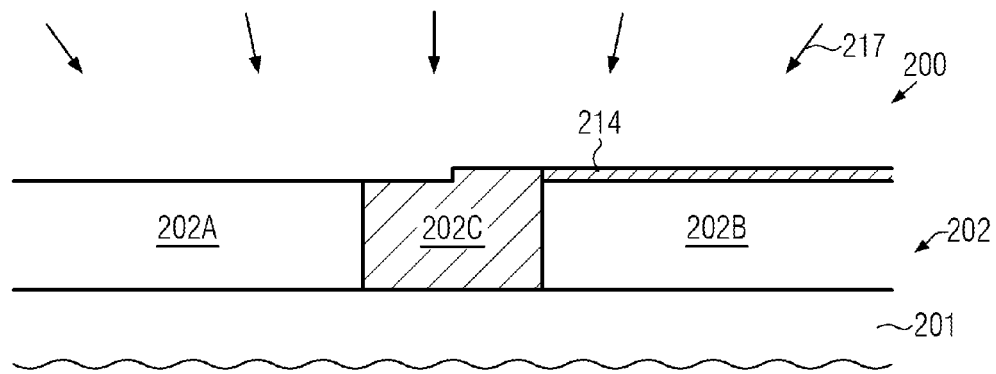

FIG. 2g schematically illustrates the semiconductor device 200 according to illustrative embodiments in which the hard mask layer 204 (FIGS. 2e, 2f) may be removed prior to performing a selective epitaxial growth process. To this end, an appropriate etch chemistry may be used during the etch process 217, for instance on the basis of highly efficient and well-established chemical solutions, such as SPM/APM when silicon nitride material is to be removed. In this manner, the hard mask layer 214 may act as an efficient etch stop material, thereby avoiding undue exposure of any parts of the active region 202B. Furthermore, the layer 214 may be provided with superior uniformity and, with a well-defined layer thickness, the material consumption during the process 217 may be determined in advance and may be taken into consideration upon selecting an appropriate thickness of the layer 214. On the other hand, undue interaction of the etch process 217 with the exposed silicon material of the active region 202A may be avoided. The removal of the layer 204 (FIGS. 2e, 2f) enables continuing the further processing on the basis of high uniform and well-defined process conditions, for instance with respect to performing a subsequent selective epitaxial growth process. That is, in some illustrative embodiments, the remaining hard mask layer 214 may be provided in the form of a silicon dioxide material, such as a pad oxide, thereby providing similar process conditions as in well-established selective epitaxial growth techniques, as previously described, since any such well-established deposition recipes may provide high degree of selectivity during the selective deposition of a silicon/germanium material, or any other silicon-based semiconductor alloy. Furthermore, since the removal of the layer 204 (FIGS. 2e, 2f) in a later manufacturing stage may be avoided, undue oxidation of a germanium species by applying hot APM during the removal of the hard mask may be avoided, in case that a silicon/germanium material is to be formed on the active region 202A.

Figure 2H:
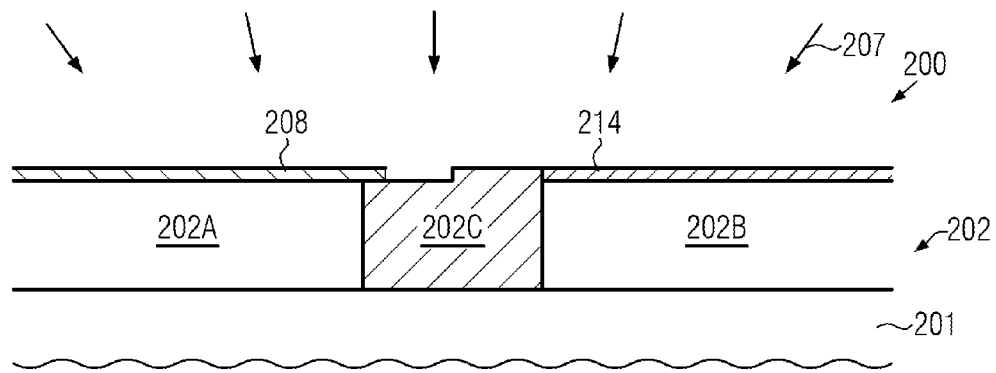

FIG. 2h schematically illustrates the semiconductor device 200 in a further advanced manufacturing stage, wherein a selective epitaxial growth process 207 may be applied in order to form a threshold adjusting semiconductor alloy 208, such as a silicon/germanium alloy, on exposed surface areas of the active region 202A. It should be appreciated that any proceeding cleaning recipes may be applied, as is also previously discussed, which may result in a certain reduction of the thickness of the layer 214, wherein, however, as discussed above, the superior uniformity and the predictability of the material consumption during any such cleaning recipes may be readily taken into consideration when selecting an appropriate thickness of the layer 214. Consequently, in particular when forming a silicon/germanium alloy, well-established deposition recipes may be applied, which may provide a high degree of selectivity between silicon dioxide material and silicon material. Thus, after the selective epitaxial growth process 207, the material 208 may be a part of the active region 202A and may impart the desired electronic characteristics to the region 202A as necessary for the further processing, i.e., the formation of a sophisticated high-k metal gate electrode structure.

Figure 2I:
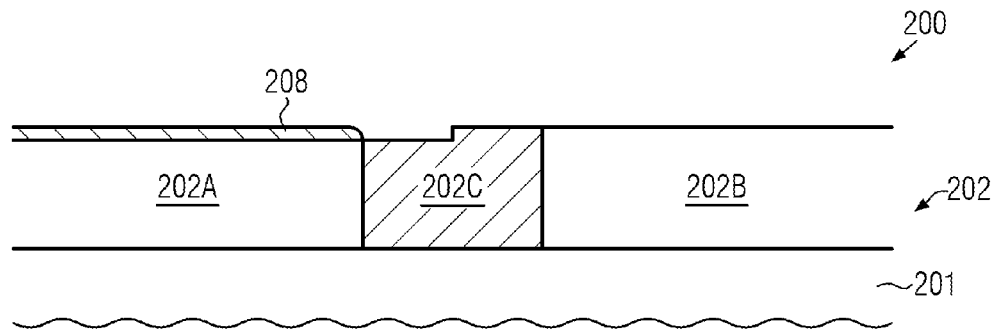

FIG. 2i schematically illustrates the device 200 after the removal of the hard mask layer 214 (FIG. 2h), which may be accomplished on the basis of well-established and highly-selective wet chemical etch chemistries, such as hydrofluoric acid and the like. It should be appreciated that, although a certain degree of material erosion may occur in the isolation region 202C, nevertheless, the device 200 may exhibit a superior surface topography compared to semiconductor devices processed on the basis of conventional strategies, since, for instance, pronounced exposure to oxide-removing etch ambients, such as hydrofluoric acid, may be significantly reduced in the process flow of the device 200, for instance due to the plasma-based patterning process 211 of FIG. 2d. Moreover, the hard mask materials, and in particular the material 214 (FIG. 2h), may be provided with superior uniformity compared to the conventional high temperature oxidation process, thereby avoiding any non-uniformities, in particular at edge regions of the active regions 202A, 202B, which may result in undue non-uniformities upon selectively growing the material 208 and also upon removing the corresponding deposition mask. Hence, the material 208 itself may be provided with superior uniformity at any edge portions that connect to the isolation structure 202C. It should be appreciated that this also holds true for an edge region in the transistor width direction, i.e., a direction perpendicular to the drawing plane of FIG. 2i. Thus, a pronounced variation of material characteristics, such as layer thickness and the like, along the transistor width direction of the material 208 may be avoided, while at the same time a less pronounced and thus a more uniform surface topography may be obtained at any edges formed by the active region 202A and the isolation region 202C. Moreover, also within the isolation region 202C and thus at any transition area between the active regions 202A, 202B, a well-defined surface topography may be provided, thereby also contributing to superior surface conditions and thus superior process uniformity during the further processing when forming the complex high-k metal gate electrode structure above the active region 202B.

Figure 2J:
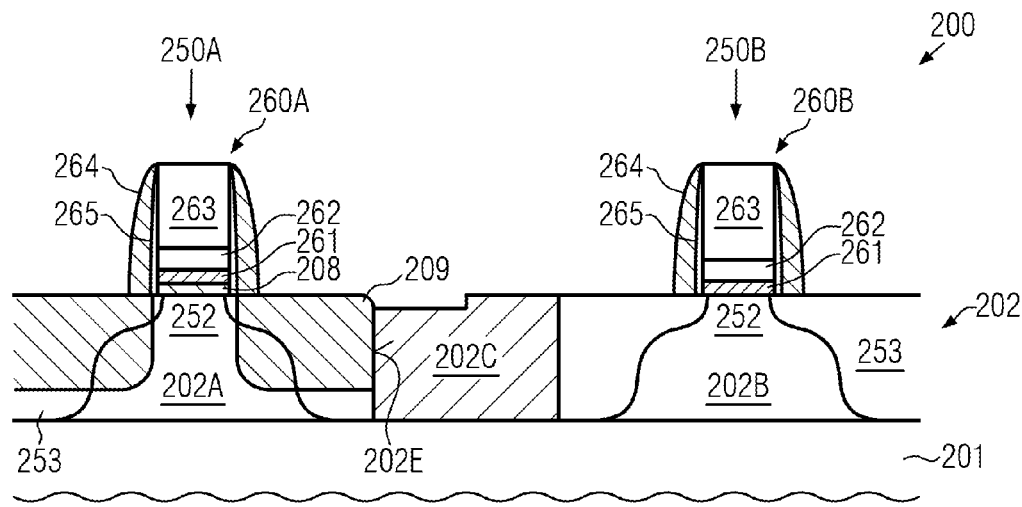

FIG. 2j schematically illustrates the semiconductor device 200 in a further advanced manufacturing stage. As illustrated, a first transistor 250A, such as a P-channel transistor, may be formed above the active region 202A, which may comprise, at least partially, the previously grown material layer 208. Similarly, a second transistor, such as an N-channel transistor 250B, is formed in and above the active region 202B. In the manufacturing stage shown, the transistors 250A, 250B may comprise drain and source regions 253, which may have any appropriate lateral and vertical dopant profile as required. Moreover, the drain and source regions 253 may laterally enclose a channel region 252, which in the case of the transistor 250A may also include at least a portion of the threshold adjusting semiconductor alloy 208. Moreover, the transistor 250A may comprise a gate electrode structure 260A, which in turn may comprise a gate dielectric material 261, a metal-containing electrode material 262 and a semiconductor-based electric material 263, wherein these materials may be laterally confined by a liner or spacer 265 and a spacer structure 264. Similarly, the transistor 250B may comprise a gate electrode structure 260B, which may basically have the same configuration and may thus also comprise the components 261, 262, 263, 264 and 265. It should be appreciated, as is also discussed with reference to the semiconductor device 100, that the gate dielectric layer 261 and/or the metal-containing electrode material 262 may differ for the gate electrode structures 260A, 260B, for instance with respect to a specific metal species for adjusting the corresponding work function, as is also described above. Furthermore, the gate dielectric materials 261 may comprise a high-k dielectric material, as is also explained above.

The transistors 250A, 250B may be formed on the basis of any appropriate process strategy, as for instance described above, wherein generally the superior surface conditions obtained after the selective epitaxial growth of the material 208 may provide superior uniformity of the resulting circuit component. For example, the complex patterning process for patterning the material layers 261, 262 and 263 may be accomplished with enhanced uniformity. Similarly, the encapsulation of these materials, for instance by means of the liner 265, may be achieved with superior reliability compared to conventional strategies, in which, for instance, the highly non-predictable surface roughness in the isolation region 202C may significantly influence the corresponding encapsulation process. Thus, as discussed above, the transistor 250A including the threshold adjusting semiconductor alloy 208 may exhibit a reduced transistor variability, for instance in terms of threshold voltage, since the material layer 208 may have substantially uniform characteristics along a transistor width direction, i.e., along the direction perpendicular to the drawing plane of FIG. 2j. In this case, transistors having basically the same configuration as the transistor 250A, which, however, differ from each other by a different transistor width, may exhibit substantially the same threshold voltage.

In some illustrative embodiments, as shown in FIG. 2j, an additional performance-enhancing mechanism may be implemented, for instance in the form of an embedded strain-inducing semiconductor material, such as a silicon/germanium alloy, a silicon/carbon alloy and the like. In the embodiment shown, the performance of the transistor 250A may be enhanced by incorporating a silicon/germanium alloy or generally a germanium species in order to obtain a compressive strain in the adjacent channel region 252. To this end, corresponding cavities may be formed in the active region 202A after the selective deposition of the material 208 and after the patterning of the gate electrode structure 260A in a stage in which the spacer structure 264 may not yet be provided or wherein a specifically-designed offset spacer may be formed so as to define the lateral offset of the material 209 with respect to the channel region 252. Also in this case, the superior surface topography at the side of the active region 202A, which directly connects to the isolation region 202C, may provide superior conditions upon patterning the resulting cavities and in particular upon re-growing the material 209 on the basis of selective epitaxial growth techniques. In this case, the material 209 may have a similar height at the isolation region 202C compared to other portions of the active regions 202A, which do not directly connect to the isolation region. Consequently, similar strain conditions may be observed in the transistor 250A, which is positioned so as to be adjacent to the isolation region 202C, as any other additional transistors that may also be formed in and above the active region 202A. In this manner, superior uniformity of the transistor characteristics may be achieved for transistors which may require the incorporation of a strain-inducing semiconductor material. It should be appreciated that the same holds true for any transistors 250B which may also require a strain-inducing mechanism, for instance based on a silicon/carbon material.

Figure 2K:
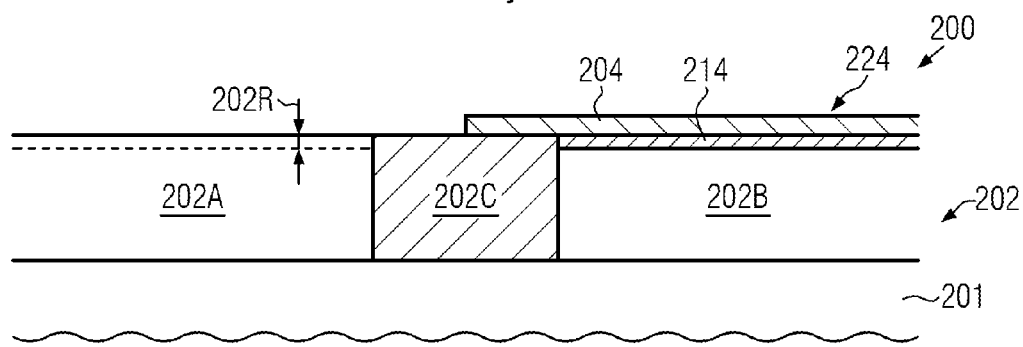
FIGS. 2k-2l schematically illustrate cross-sectional views of the semiconductor device according to further illustrative embodiments in which a silicon dioxide material and a silicon nitride material may be used as a growth mask upon forming the threshold adjusting semiconductor alloy.

FIG. 2k schematically illustrates the semiconductor device 200 in a manufacturing stage in which the hard mask layer stack 224 may cover the active region 202B, while the active region 202A is exposed in order to prepare the surface thereof for the selective deposition of the threshold adjusting semiconductor material. As shown, a certain degree of recessing 202R may be provided, as is also discussed above. In this case, any cleaning processes prior to the selective deposition process may be performed on the basis of the layer 204.

Figure 2L:
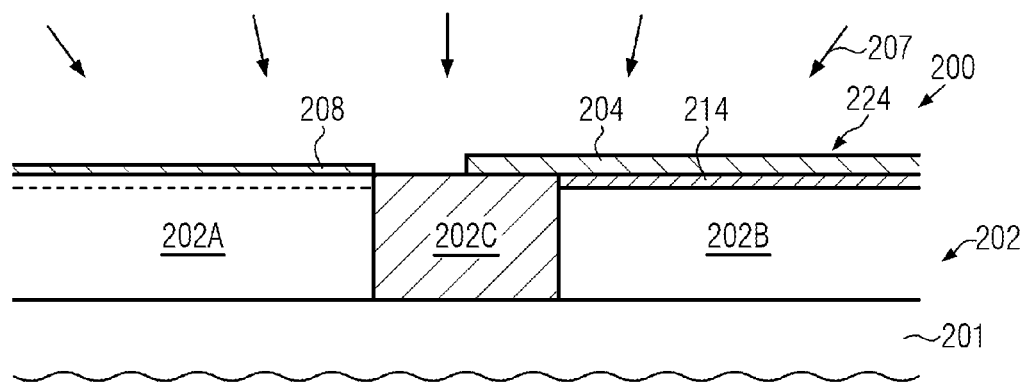

FIG. 2L schematically illustrates the semiconductor device 200 during the selective epitaxial deposition process 207 in order to form the semiconductor alloy 208, as is also described above. In this case, the hard mask layer stack 224 as a whole may act as an efficient deposition mask. Thereafter, the layer stack 224 may be removed, for instance on the basis of wet chemical etch recipes and the like, wherein a corresponding material erosion in the layer 208 caused by the additional removal of the layer 204 may readily be taken into consideration upon forming the material layer 208. After the removal of the layer stack 224, the further processing may be continued, as described above.

As a result, the present disclosure provides manufacturing techniques in which superior uniformity may be accomplished during the selective deposition of a threshold adjusting semiconductor material by providing a hard mask stack comprising at least two hard mask materials, which may be patterned on the basis of a plasma-based etch process. In some illustrative embodiments, one layer of the hard mask layer stack may be removed prior to the selective epitaxial growth process. In this manner, superior transistor characteristics may be obtained, for instance in terms of threshold voltage and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a first hard mask layer on a first active region and a second active region of a semiconductor device wherein the first and second active regions are separated by an isolation region;
forming a second hard mask layer on said first hard mask layer and said isolation region;
forming an etch mask above said second active region and at least a portion of said isolation region;
with said etch mask in position, performing one or more plasma-assisted etch process to remove said first hard mask layer and said second hard mask layer from said first active region;
forming a layer of a semiconductor alloy on said first active region and using at least one of said first hard mask layer and said second hard mask layer on said second active region as a growth mask;
exposing said second active region; and
forming a first gate electrode structure of a first transistor on said layer of a semiconductor alloy and a second gate electrode structure of a second transistor on said second active region, said first and second gate electrode structures comprising a metal-containing gate electrode material and a gate insulation layer comprising a high-k dielectric material.

2. The method of claim 1, further comprising removing said second hard mask layer from above said second active region prior to forming said layer of a semiconductor alloy.

3. The method of claim 2, wherein forming said layer of a semiconductor alloy comprises using said first hard mask layer as said growth mask.

4. The method of claim 1, wherein said first hard mask layer is formed to comprise a silicon dioxide material.

5. The method of claim 4, wherein said second hard mask layer is formed so as to comprise a silicon nitride material.

6. The method of claim 1, further comprising forming said first hard mask layer prior to forming said first and second active regions.

7. The method of claim 6, further comprising adjusting a thickness of said first hard mask layer prior to forming said second hard mask layer by performing a wet chemical process.

8. The method of claim 7, wherein adjusting a thickness of said first hard mask layer comprises determining a thickness of said first hard mask layer and controlling said wet chemical process by using said determined thickness.

9. The method of claim 1, further comprising forming a strain-inducing semiconductor material in said active region after forming said layer of a semiconductor alloy.

10. A method of forming a semiconductor device, the method comprising:
   forming a first hard mask layer on a first active region and a second active region, wherein said first and second active regions are separated by an isolation region;
   forming a second hard mask layer on said first hard mask layer and said isolation region;
   forming an etch mask above said second active region and at least a portion of said isolation region;
   with said etch mask in position, performing one or more plasma-assisted etch process to remove said first hard mask layer and said second hard mask layer from said first active region;
   removing said second hard mask layer from above said second active region after the removal of said first hard mask layer and said second hard mask layer from said first active region;
   forming a layer of a semiconductor alloy in said first active region by using said first hard mask layer as a growth mask; and
   forming a first gate electrode structure of a first transistor on said first active region including said layer of a semiconductor alloy and a second gate electrode structure of a second transistor on said second active region.

11. The method of claim 10, further comprising forming said first hard mask layer prior to incorporating a well dopant species into said first and second active regions.

12. The method of claim 11, further comprising adjusting a thickness of said first hard mask layer prior to forming said second hard mask layer by performing a wet chemical process.

13. The method of claim 12, wherein adjusting a thickness of said first hard mask layer further comprises determining a thickness of said first hard mask layer and controlling said wet chemical process by using said determined thickness and a predefined target thickness.

14. The method of claim 10, wherein said first hard mask layer is comprised of a silicon dioxide material and said second hard mask layer is comprised of a silicon nitride material.

15. The method of claim 10, wherein forming said first and second gate electrode structures comprises forming a high-k dielectric material above said threshold adjusting semiconductor material and said second active region and forming a metal-containing electrode material above said high-k dielectric material.

16. The method of claim 10, further comprising forming a strain-inducing semiconductor material in said first active region.

17. The method of claim 10, wherein removing said first and second hard mask layers selectively from said first active region comprises performing a plasma-assisted etch process.

18. A method, comprising:
   forming a mask layer stack on a first active region and a second active region of a semiconductor device, wherein said first and second active regions are separated by an isolation region and at least a portion of the mask layer stack is formed on said isolation region;
   forming an etch mask above said second active region and at least a portion of said isolation region;
   with said etch mask in position, performing one or more plasma-assisted etch process to remove said mask layer stack selectively from said first active region by performing at least one plasma-based etch process;
   forming a layer of a semiconductor alloy on said first active region and using at least one layer of said mask layer stack on said second active region as a growth mask;
   performing an etch process so as to expose said second active region;
   forming a first gate electrode structure on said first active region and a second gate electrode structure on said second active region; and
   forming a strain-inducing semiconductor material at least in said first active region in the presence of said first gate electrode structure.

19. The method of claim 18, wherein at least one layer of said layer stack is formed prior to forming said first and second active regions.

20. A method, comprising:
   forming a first hard mask layer on a first active region and a second active region of a semiconductor device wherein the first and second active regions are separated by an isolation region;
   forming a second hard mask layer on said first hard mask layer and said isolation region;
   forming an etch mask above said second active region and at least a portion of said isolation region;
   with said etch mask in position, performing one or more plasma-assisted etch process to remove said first hard mask layer and said second hard mask layer from said first active region;
   forming a layer of a semiconductor alloy on said first active region using said second hard mask layer as a growth mask;
   exposing said second active region; and
   forming a first gate electrode structure of a first transistor on said layer of a semiconductor alloy and a second gate electrode structure of a second transistor on said second active region, said first and second gate electrode structures comprising a metal-containing gate electrode material and a gate insulation layer comprising a high-k dielectric material.

* * * * *